(12) United States Patent
Palaskas et al.

(10) Patent No.: US 9,194,911 B2
(45) Date of Patent: Nov. 24, 2015

(54) HARDWARE-EFFICIENT ON-CHIP CALIBRATION OF ANALOG/RF THROUGH SUB-SAMPLING

(75) Inventors: Georgios Palaskas, Portland, OR (US); Jorge Hermosillo, Zapopan (MX); Marian K. Verhelst, Mechelin (BE)

(73) Assignee: iNTEL CORPORATION, Santa Clara, CA (US)

( * ) Notice: Subject to any disclaimer, the term of this patent is extended or adjusted under 35 U.S.C. 154(b) by 745 days.

(21) Appl. No.: 13/341,940

(22) Filed: Dec. 31, 2011

(65) Prior Publication Data

US 2013/0173203 A1    Jul. 4, 2013

(51) Int. Cl.
*G01R 31/3167* (2006.01)
*G01R 31/3181* (2006.01)

(52) U.S. Cl.
CPC .................................. *G01R 31/31813* (2013.01)

(58) Field of Classification Search
CPC ..................... G01R 31/31813; G01R 31/3187; G01R 31/2803; G01R 31/2804; G01R 31/2884; G01R 31/2851; G01R 31/3163; G01R 31/3167; G01R 31/31715; G01R 31/31716; G01R 31/31723; G01R 31/2282; G01R 31/317; G01R 31/31724; H04B 17/00; H04B 17/0012; H04B 17/0015; H04B 17/0027; H04B 17/0062; H04B 17/0085; H04B 17/15; H04B 17/19; H04B 17/29
USPC ......................................................... 702/117
See application file for complete search history.

(56) References Cited

U.S. PATENT DOCUMENTS 7,221,918 B1 * 5/2007 Grasbeck et al. .......... 455/251.1
7,340,662 B1 * 3/2008 McElwee et al. ............. 714/742

OTHER PUBLICATIONS

Bhattacharya et al., "A Built-In Loopback Test Methodology for RF Transceiver Circuit using Embedded Sensor Circuits", 2004, IEEE Proceedings of the 13th Asian Test Symposium (ATS 2004).*
Zhang et al., "A Low Power 4-bit Interleaved Burst Sampling ADC for Sub-GHz Impulse UWB Radio", 2007, IEEE.*
Tandur et al., "Adaptive Compensation of Frequency Selective IQ Imbalance and Carrier Frequency Offset for OFDM Based Receivers", 2007, IEEE.*
"Stratix II GX Transceiver Block Overview", Oct. 2007, Altera Corporation, p. 1-1 to p. 1-10.*
Robert Bogdan Staszewski, Digital RF and Digitally-Assisted RF (Invited), Nov. 30-Dec. 2, 2011, RFIT2011-IEEE International Symposium on Radio-Frequency Integration Technology, Beijing, China, pp. 9-16.*

* cited by examiner

*Primary Examiner* — Toan Le
(74) *Attorney, Agent, or Firm* — Carrie A. Boone, P.C.

(57) ABSTRACT

A digital on-die-test engine (OTE) generates stimuli signals for an analog/RF circuit, where the OTE is embedded within the circuitry. The stimuli signals are injected into the circuit, feed through the circuit, and are received back into the OTE for analysis. The OTE includes an input subsystem to receive signals from various locations throughout the circuit. The received signals are sub-sampled before being tested. The OTE includes memory-aware and memory-less algorithms for testing the signals. The OTE is capable of changing the configuration of the circuit, where needed, following the tests.

15 Claims, 6 Drawing Sheets

HARDWARE-EFFICIENT ON-CHIP CALIBRATION OF ANALOG/RF THROUGH SUB-SAMPLING

TECHNICAL FIELD

This application relates to on-chip circuitry for testing the components on the chip.

BACKGROUND

After production, analog and radio frequency (RF) blocks undergo extensive calibrations and tests in the manufacturing environment, to check whether their performance is within specification, and to retune components when necessary. The integration of these tests is considered expensive and are thus located off-chip, which limits the testing of the circuit to the manufacturing floor.

Some system manufacturers are considering on-chip self-test and self-tuning, as they promise significant savings in both manufacturing test/tune time and in equipment cost. However, the desire for on-chip testing is often outweighed by the need to keep chip area minimal and the unavailability of excess real estate on the chip.

Thus, there is a continuing need for an on-chip test circuit that overcomes the shortcomings of the prior art.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a digital on-die-test engine (OTE) is disclosed to generate stimuli signals for an analog/RF circuit, where the OTE is embedded within the circuitry. The stimuli signals are injected into the circuit, feed through the circuit, and are received back into the OTE for analysis. The OTE includes memory-aware and memory-less algorithms for testing the signals. The OTE is capable of changing the configuration of the circuit, where needed, following the tests.

In the following detailed description, reference is made to the accompanying drawings, which show by way of illustration specific embodiments in which the subject matter described herein may be practiced. However, it is to be understood that other embodiments will become apparent to those of ordinary skill in the art upon reading this disclosure. The following detailed description is, therefore, not to be construed in a limiting sense, as the scope of the subject matter is defined by the claims.

Figure 1:
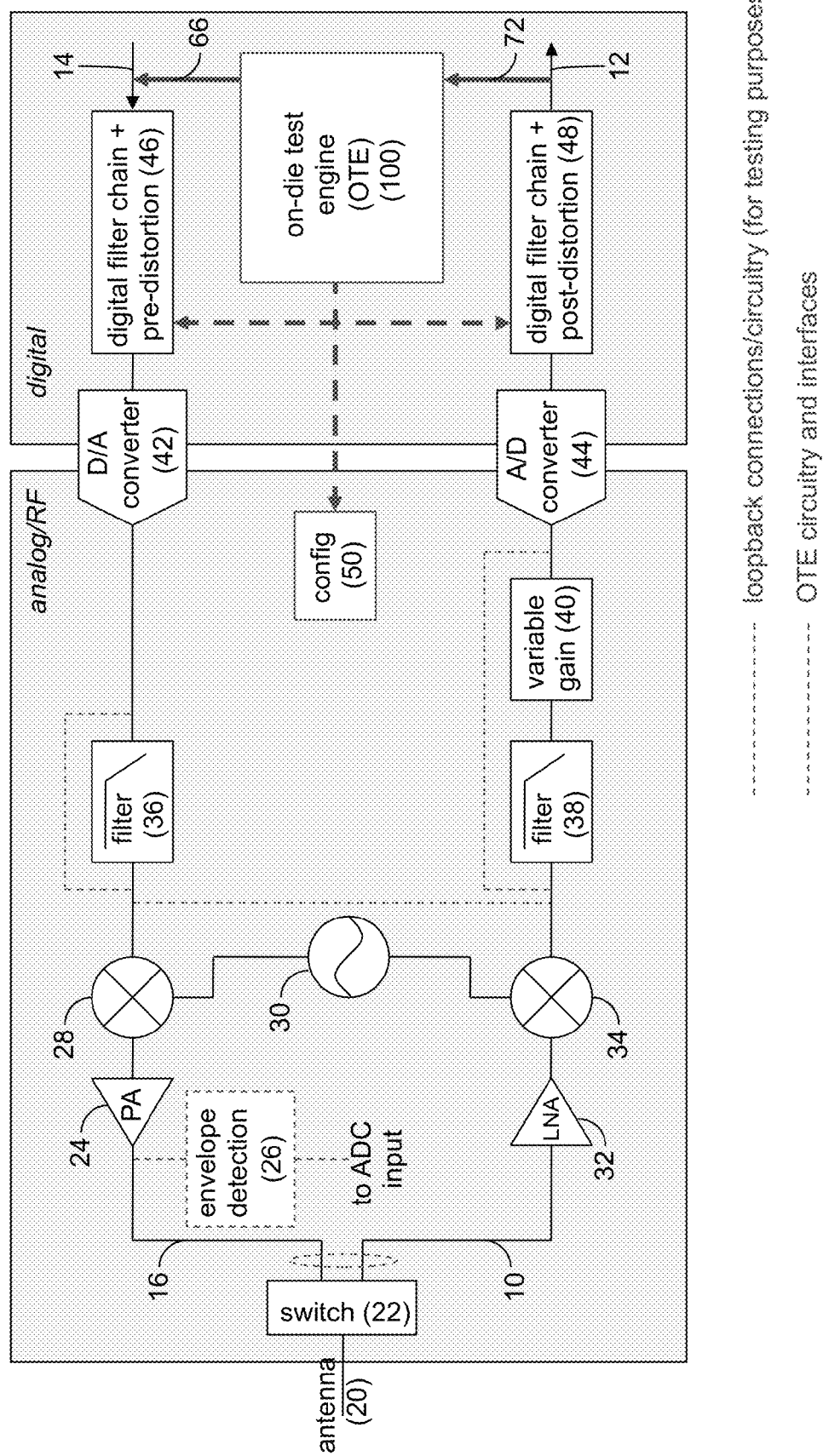
FIG. 1 is a simplified block diagram of wireless transceiver with an on-die test engine and analog loopback, according to some embodiments.

FIG. 1 is a simplified block diagram of an analog/RF circuit 200 of a wireless radio front-end, including an OTE 100, according to some embodiments. The analog/RF circuit 200, or transceiver 200, which is also described herein as a circuit under test (CUT), consists of both an analog/RF domain and a digital domain. The analog/RF domain consists of the transmitter portion (top) and the receiver portion (bottom). During normal operation, a signal 10 received by the antenna 20 traverses the receiver portion of the transceiver 200. The received signal 10 passes through the switch 22 and feeds into a low noise amplifier (LNA) 32, passes through a mixer 34, a filter 38, and a variable gain amplifier 40 to be received into an analog-to-digital (A/D) converter 44 and is converted to a digital signal.

Once in the digital domain, the digital signal is fed into a digital filter chain, which may or may not include post-distortion circuitry 48, as signal 12. The signal 12 is thereafter passed on to other circuitry for whatever its intended purpose. The transceiver 200 may be part of a cellular phone, a laptop computer, and so on.

Similarly, a signal intended for transmission outside the circuit traverses a path at the top of the transceiver 200 (the transmitter portion). Signal 14 feeds into a digital filter chain, which may or may not include pre-distortion circuitry 46, then leaves the digital domain through a digital-to-analog (D/A) converter 42, where the signal passes through a filter 36, a mixer 28, and a power amplifier 24 before being received, as analog signal 16, through the switch 22 and transmitted by the antenna 20 to a remote receiver. During normal use of the transceiver, these operations are performed without the involvement of the OTE 100.

Figure 2:
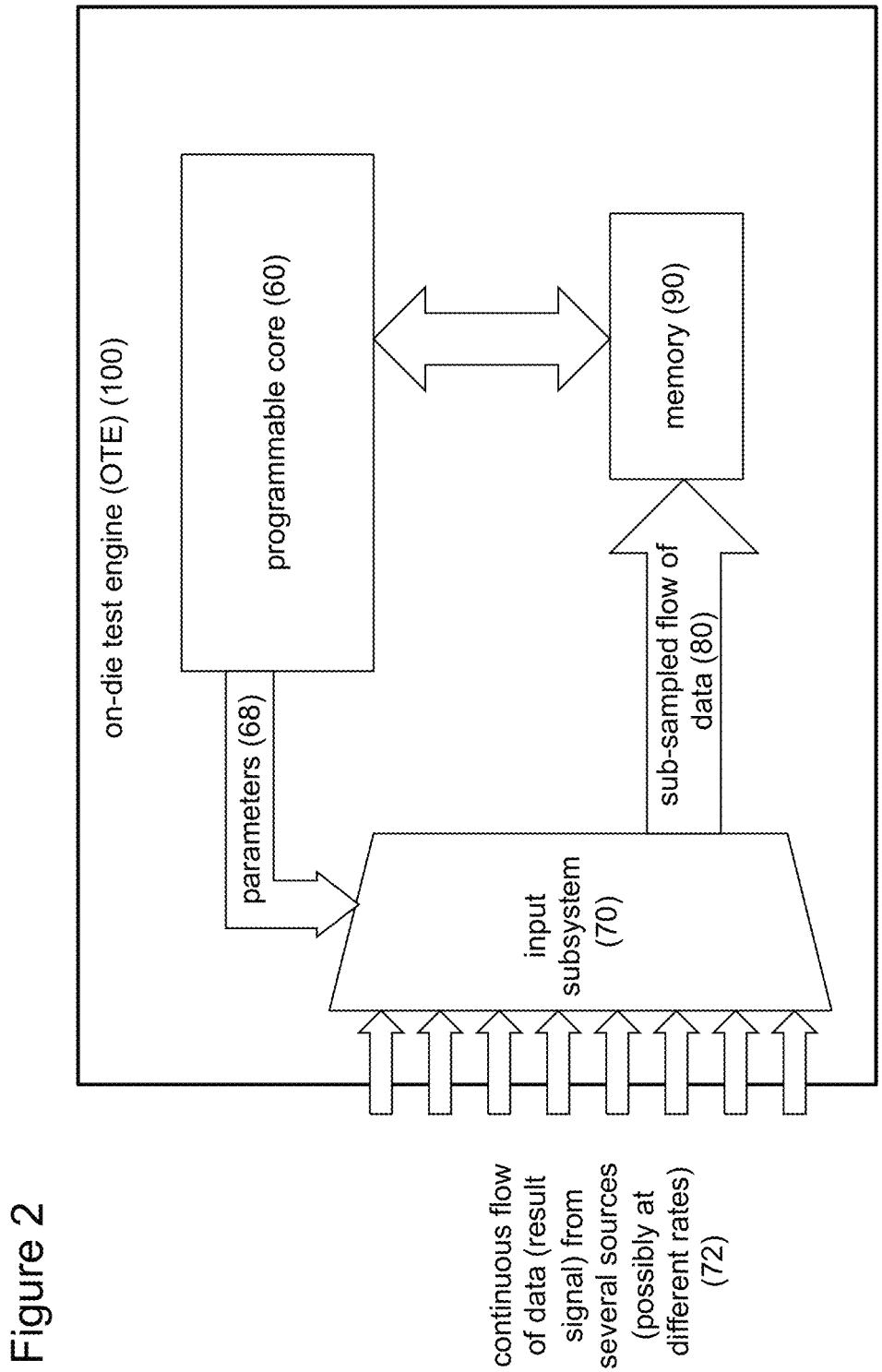
FIG. 2 is a detailed block diagram of the on-die test engine of FIG. 1, according to some embodiments.

Embedded within this transceiver architecture is the OTE 100. In some embodiments, the OTE 100 consists of hardware, software, and firmware that operate together to perform tests on the transceiver 200 or other CUT. A more detailed structural diagram of the OTE 100 is shown in FIG. 2, according to some embodiments. In addition to the configuration circuit 50, the OTE 100 relies on loopback and bypass connections and circuitry (dotted lines), including an envelope detection circuit 26, for maximum flexibility in testing the transceiver 200.

FIG. 2 is a structural block diagram of the OTE 100, according to some embodiments. The OTE 100 consists of a programmable core 60, which includes a microcontroller as well as firmware and/or software executed by the microcontroller. The programmable core 60 transmits a signal 66, known also as a test signal 66, through one or more paths along the CUT and runs algorithms that test the signal 72 as it is received back into the OTE.

The test signal 66 is sent through the CUT during calibration/testing. The characteristics of the test signal 66 are based on the calibration/testing algorithm to be run. The signal generation that is performed by the OTE 100 is outside the scope of this disclosure.

The OTE 100 includes an input subsystem 70, which receives a result signal 72, which is from possibly several different parts of the CUT. FIG. 2 shows multiple arrows coming into the input subsystem 70, which is meant to convey that the result signal 72 being received may come from different paths and at different points of the CUT. Thus, for example, the signal 72 may be received directly into the input subsystem 70 from the output from one of the filters 36, 38. Or, the signal 66 may bypass the filter 36, as indicated by the dotted lines before being received, as result signal 72, into the input subsystem 70. In fact, the signal 66 may bypass several components of the analog/RF portion of the transceiver 200, and instead simply pass through the two filters 36, 38, before being received as the result signal 72 into the OTE 100. The OTE 100 is able to control the path of the signal 66 as it moves through the transceiver 200. Further, the OTE 100 is able to designate a particular point or node in the transceiver 200 from which the signal is received directly into the input subsystem 70. The result signal 72 received into the input subsystem 70 thus is received from one of several different nodes of the CUT, with the data possibly flowing at different rates.

In some embodiments, the programmable core 60 also sends other parameters 68 to the input subsystem 70, namely a burst length parameter (B), a gap length parameter (G), and a number of samples parameter (M). These parameters are determined based on the algorithm to be executed, and are discussed further below.

The input subsystem 70 receives the incoming data stream (result signal) 72 and, based on the parameters 68 received from the programmable core 60, extracts some of the data stream for further processing, shown in FIG. 2 as sub-sampled flow of data 80, also known as the sub-sampled result signal 80. Put another way, the input subsystem 70 filters out some of the incoming data stream 72, based on the parameters 68 received, leaving a smaller set of data (the sub-sampled result signal 80) for testing. Thus, the sub-sampled flow 80 is a subset of the incoming data stream 72.

The OTE 100 also includes a memory 90 for storing the sub-sampled result signal 80, as explained further below. In some embodiments, the memory 90 is small, relative to those memories generally considered necessary for running the test algorithms. Similarly, the data path along which the sub-sampled result signal travels 80 is considered small, relative to the more extensive data paths typically needed to run the test algorithms.

Figure 3:
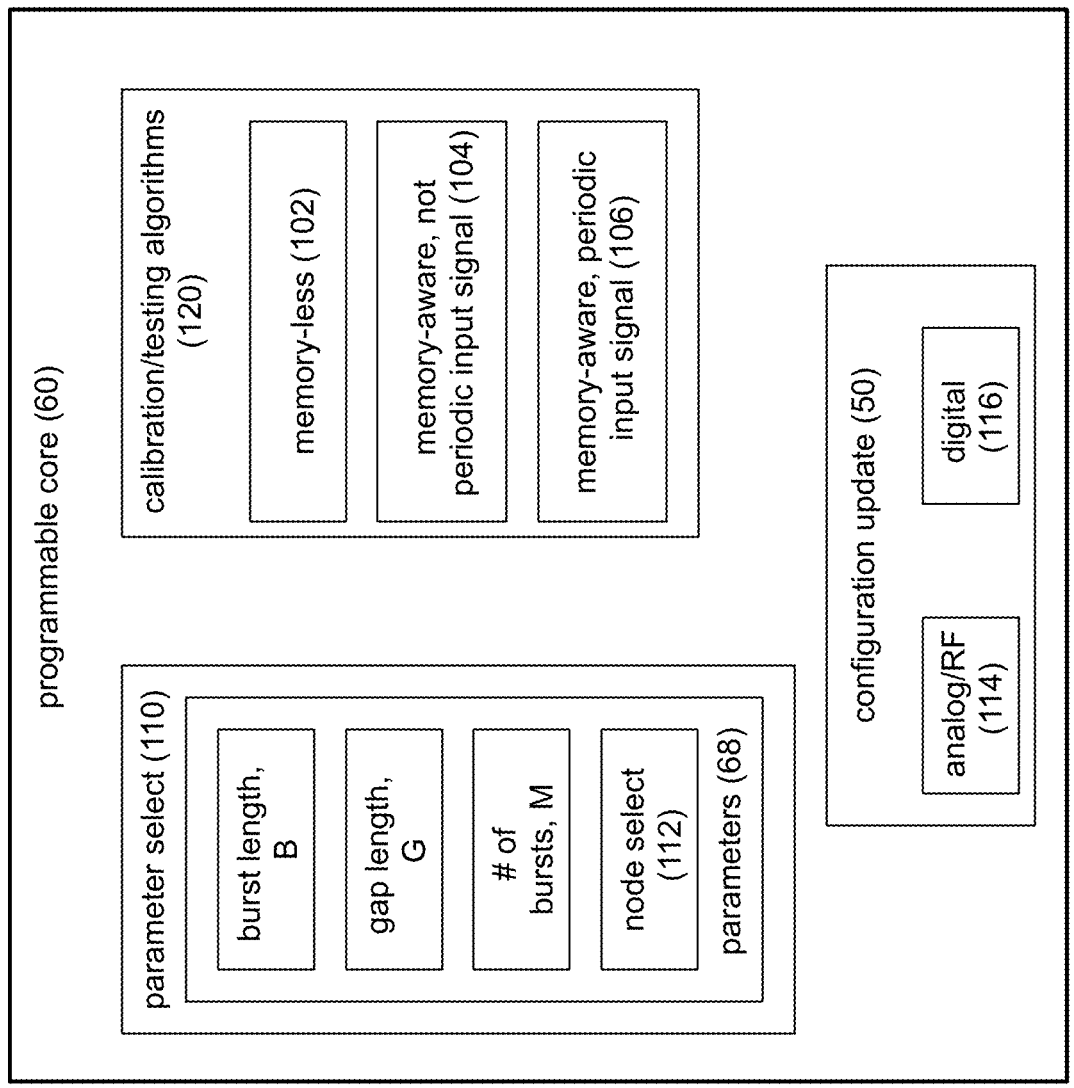
FIG. 3 is a simplified block diagram of the programmable core of the on-die test engine of FIG. 1, according to some embodiments.

FIG. 3 is a functional block diagram of the programmable core 60 of the OTE 100, according to some embodiments. The programmable core 60 includes a parameter select block 110, a calibration/testing algorithms block 120, and a configuration update block 50. The parameters 68 sent by the programmable core 60 enable the input subsystem 70 to subdivide the result signal 72 into the sub-sampled result signal 80. In some, but not all, cases, the parameters 68 are selected based on the algorithm being run. The "node select" parameter 112 indicates which feed (arrows) of incoming data 72 to select for analysis, with each arrow representing a node of the CUT. The burst length, B, gap length, G, and number of bursts, M, also characterize how the input subsystem 70 is to filter the data 72.

The programmable core 60 also includes the calibration/testing algorithms 120. In some embodiments, the calibration/testing algorithms 120 include memory-less or memory-agnostic algorithms 102, memory-aware algorithms in which the input signal is not periodic 104, and memory-aware algorithms in which the input signal is periodic 106. Each of these algorithms is described in more detail below.

Finally, after the algorithms 120 have been run, the programmable core 60 of the OTE 100 is able to perform configuration updates 50 to the CUT, in some embodiments. These configuration updates 50 are either to optimize the CUT or to fix problems identified by the calibration/testing or for iterative calibration algorithms. In the case of the transceiver 200, the programmable core 60 is able to perform updates to both the analog/RF portion 114 and to the digital portion 116.

In some embodiments, the OTE 100 is a design-for-test (DFT) feature. In terms of cost and real estate, relative to the rest of the circuitry of the transceiver 200 (some of which is not included in FIG. 1), the OTE 100 is small, in some embodiments. As most calibrations run infrequently and at power-on, latency and power consumption are less of an issue than with some test circuits. Nevertheless, there is an interest among system designers to keep the size and cost of on-chip testing circuits small, relative to other circuitry in the system.

Further, in some embodiments, the OTE 100 is flexible, designed to be used in many different products. Thus, the transceiver 200 of FIG. 1 is merely an example of a CUT that may benefit from having the OTE 100 embedded in its design. In some embodiments, a manufacturer of several different types of transceivers will include the OTE 100 in every transceiver, despite the design differences between each transceiver. Further, in some embodiments, a manufacturer of several different types of systems, each system being structurally and functionally different from the other systems, will include the OTE in each system produced.

In some embodiments, the OTE 100 generates a signal 66, transmits the signal through the circuitry 200 along one of several possible paths, and receives the signal 72 back for subsequent analysis. From these operations, the configuration circuit 50 is able to adjust other circuits in the transceiver 200, as needed, to optimize its performance. The signal 66 produced by the OTE 100 is based on one of several algorithms that are run in the OTE 100 to test the transceiver 200.

In some embodiments, the testing and tuning algorithms run by the OTE 100 require wide digitized data words traveling at a high rate. For example, in a WiFi transceiver, the signal typically would be 2×16-bit data at 40 mega-samples per second. Running a periodogram over this data, for example, would require 1000M butterfly operations per second. While a large processor could manage such operations, the low cost and small real estate objective of the OTE 100 would be impossible to maintain with a processor of this size.

Further, processing this amount of data would require dedicated data paths. This, too, would increase the cost and amount of real estate dedicated to the OTE 100.

The OTE 100 thus avoids these concerns by performing data sub-sampling. This allows the OTE 100 to process the high-speed data without any external data path or input buffer requirements. In some embodiments, the OTE 100 sub-samples the input data, as sub-sampled data 80, before running the algorithms instead of trying to process the raw digitized data stream 72. In other words, the input subsystem 70 will only selectively pass a subset of the input samples to the OTE 100. As will be shown below, this allows the real-time requirements of the CUT to be scaled to the capability of the OTE 100. As a result, in some embodiments, the OTE 100 is able to execute any calibration or test algorithm (programmed in its firmware), despite the OTE having a small footprint (not requiring dedicated hardware or input buffers), relative to the CUT.

In light of the sub-sampling paradigm, in some embodiments, the calibration/testing algorithms 120 of the OTE 100 are split into three categories: memory-less 102, and memory-aware (not periodic input signal) 104, and memory-aware (periodic input signal) 106. The calibration/testing algorithms 120 are deemed memory-less algorithms if the calibration/testing algorithm does not target the measurement or calibration of any memory effect (or frequency-dependent characteristic of the CUT). An example of a memory-less algorithm is DC-offset calibration. The calibration/testing algorithms 120 are deemed memory-aware if the calibration/testing algorithm does target the measurement or calibration of any memory effect (or frequency-dependent characteristic of the CUT). An example of a memory-aware algorithm is frequency-selective IQ imbalance calibration (filter compensation).

The first class of algorithms, the memory-less algorithms 102, are insensitive to the sub-sampling ratio or the number of samples that get dropped, as all frequency information is irrelevant. As a result, when establishing an appropriate signal 66 for executing the memory-less algorithms 102, the OTE 100 may simply request a single new sample whenever the algorithm is done processing the previous sample.

In some embodiments, the algorithms 120 running on the OTE 100 do not have to be adapted compared to non-sub-sampling algorithms. Instead, it is the input data into the algorithm that is adapted, by sub-sampling the data in an intelligent fashion.

Figure 4:
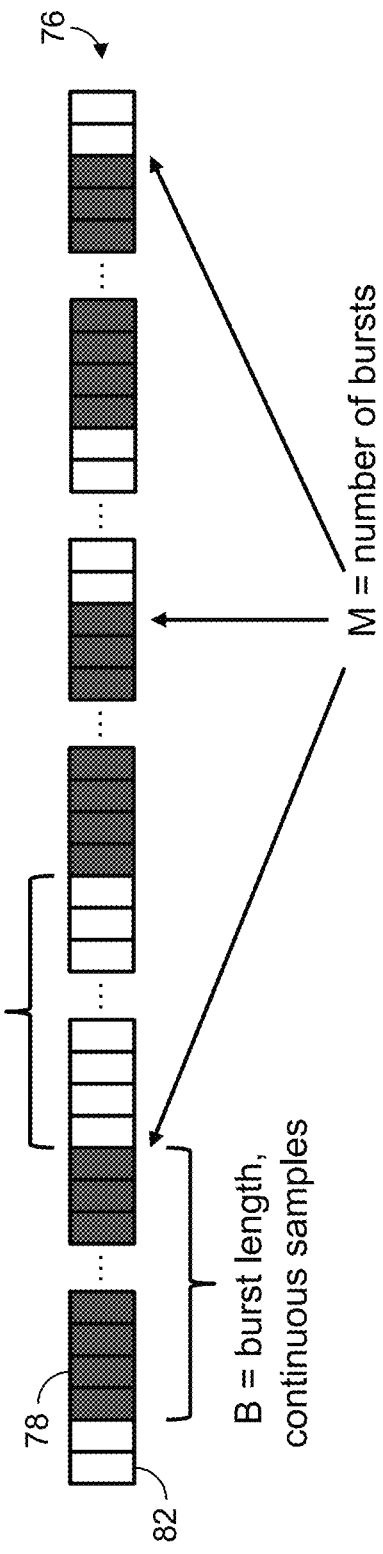
FIG. 4 is a simplified block diagram showing the general concept for the sub-sampling scheme used by the on-die test engine of FIG. 1, according to some embodiments.

FIG. 4 is a simplified block diagram showing the general concept for the sub-sampling scheme used by the OTE 100, according to some embodiments. A stream 76 is depicted, which is representative of the signal 66 generated by the input subsystem 70. The stream 76 consists of samples 78 (shaded) and non-samples 82 (unshaded) that are disposed between the samples. A burst, B, is a continuous stream of samples 78 and a gap, G, is a continuous stream of non-samples 82, where both B and G are integers. The number of bursts is given by M, also an integer. The total number of samples, N, is given by the number of continuous samples, B, multiplied by the number of bursts, M. The total number of samples, N, is the total number of samples for a given encapsulated operation.

An encapsulated operation is defined as one section of the algorithm that operates over a set of samples that are completely unrelated to another set of samples. An encapsulated operation may thus be a section of an iteration of the algorithm, a complete iteration, or the full algorithm operation. In some embodiments, the input subsystem 70 of the OTE 100 is reset between encapsulation operations.

Figure 5:
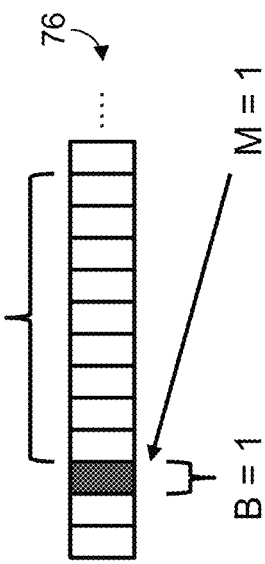
FIG. 5 is a diagram depicting the sub-sampling scheme using algorithms that are insensitive to memory, according to some embodiments.

The memory-less algorithms 102 do not need consecutive samples to operate. The memory-less algorithm 102 may thus operate on a single sample 78, a burst of consecutive samples, or a combination of consecutive and non-consecutive samples. Thus, when executing a memory-less algorithm 102, the input subsystem 70 receives the node select parameter 112 from the programmable core 60, to indicate where in the CUT the signal is coming from. FIG. 5 is a block diagram depicting an incoming data stream 76 for the memory-less algorithm 102.

Unlike the memory-less algorithms 102, the memory-aware algorithms 104 and 106 need to operate on consecutive samples to be aware of their frequency content. In some embodiments, the OTE 100 resolves this issue in one of two ways: 1) by passing bursts of consecutive samples 78 to the OTE 100, or 2) by passing single samples 78, but sampling "slightly aperiodically". In some embodiments, the first technique is used for the memory-aware algorithms 104 in which the signals are not periodic while the second technique is used for memory-aware algorithms 106 in which the signals are periodic.

Figure 6:
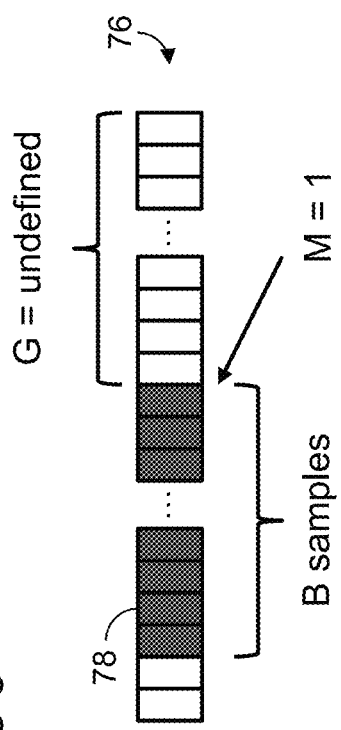
FIG. 6 is a diagram depicting the sub-sampling scheme using memory-aware algorithms and non-periodic signals, according to some embodiments.

FIG. 6 is a block diagram characterizing the incoming data stream 76 needed for memory-aware algorithms 104 in which the signal 66 is not periodic, according to some embodiments. The OTE 100 takes a series of samples 78 that are contiguous in time. Because the memory-aware algorithms 104 are measuring frequency components of the signal, gaps in between samples are not permitted. In FIG. 6, B contiguous samples 78 are extracted from the incoming signal 66 to produce the sub-sampled data 80, because the memory-aware algorithm 104 needs to exploit all the correlation that exists between the samples.

When bursts of consecutive samples are passed to the memory 90, the burst length, B, is kept small, in some embodiments. The burst length, B, determines the amount of data to be buffered, so keeping the burst length small maintains the objective of keeping the OTE 100 small, relative to other hardware in the system 200. Thus, in some embodiments, the burst length depends on the slowest frequency of interest to the algorithm 104 being tested. Empirical tests show that the memory-aware algorithms 104 used by the OTE 100 work with burst lengths of 128 samples or less. In some embodiments, the OTE 100 requests (or is fed) a new burst only after it is done processing the previous burst. In some embodiments, the OTE 100 executes several different memory-aware algorithms 104 as part of its calibration/testing suite, with each algorithms having a different requirements for the size of the sample, B.

Figure 7:
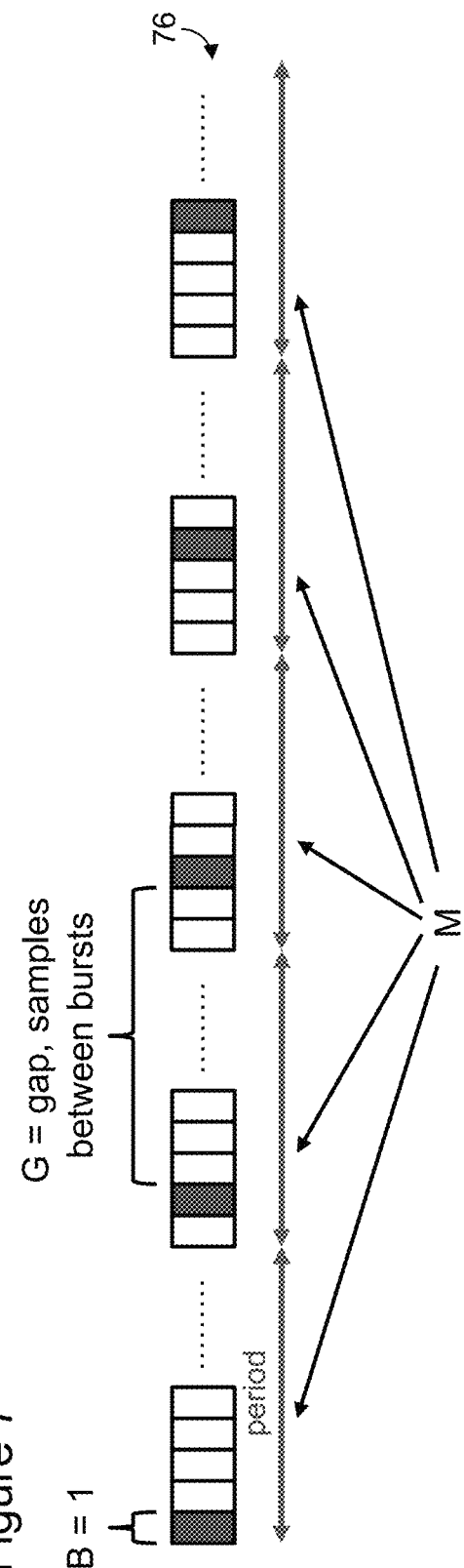
FIG. 7 is a diagram depicting the sub-sampling scheme using memory-aware algorithms and periodic signals, according to some embodiments.

The memory-aware algorithms 106 may also be sampled by passing single samples 78, but sampling them "slightly aperiodically", in some embodiments. This sampling technique, as illustrated in FIG. 7, is used for the memory-aware algorithms 106 in which the test signal is periodic. A burst length of 1 may be used if the sub-sampling period is a fractional multiple of the test stimuli periodicity. For example, when using a stimuli signal with a periodicity of $T_p$ samples, a sub-sampling ratio of $k*T_p+1$ (k integer) will result in capturing seemingly consecutive samples, while the processing may still be done at low speed without additional buffer memory being needed.

FIG. 7 shows how sub-sampling works for memory-aware algorithms 106 with periodic signals, according to some embodiments. A first sample 78 of length 1 is obtained in the first sample location of a first period. A second sample is taken in the second sample location of a second period. A third sample is taken in the third sample location of a third period. A fourth sample is taken in the fourth sample location of a fourth period. Because the signal represented by the sample stream is periodic, taking a single sample during each time period enables the periodic signal to be reproduced.

Thus, as described above, the OTE 100 enables three categories of calibration/testing to be performed: memory-less algorithms 102, memory-aware algorithms 104 with continuous bursts of samples (for non-periodic signals), and memory-aware algorithms 106 with a sub-sampling ratio of $k*T_p+1$ (for integer, k) (for periodic signals).

Figure 8:
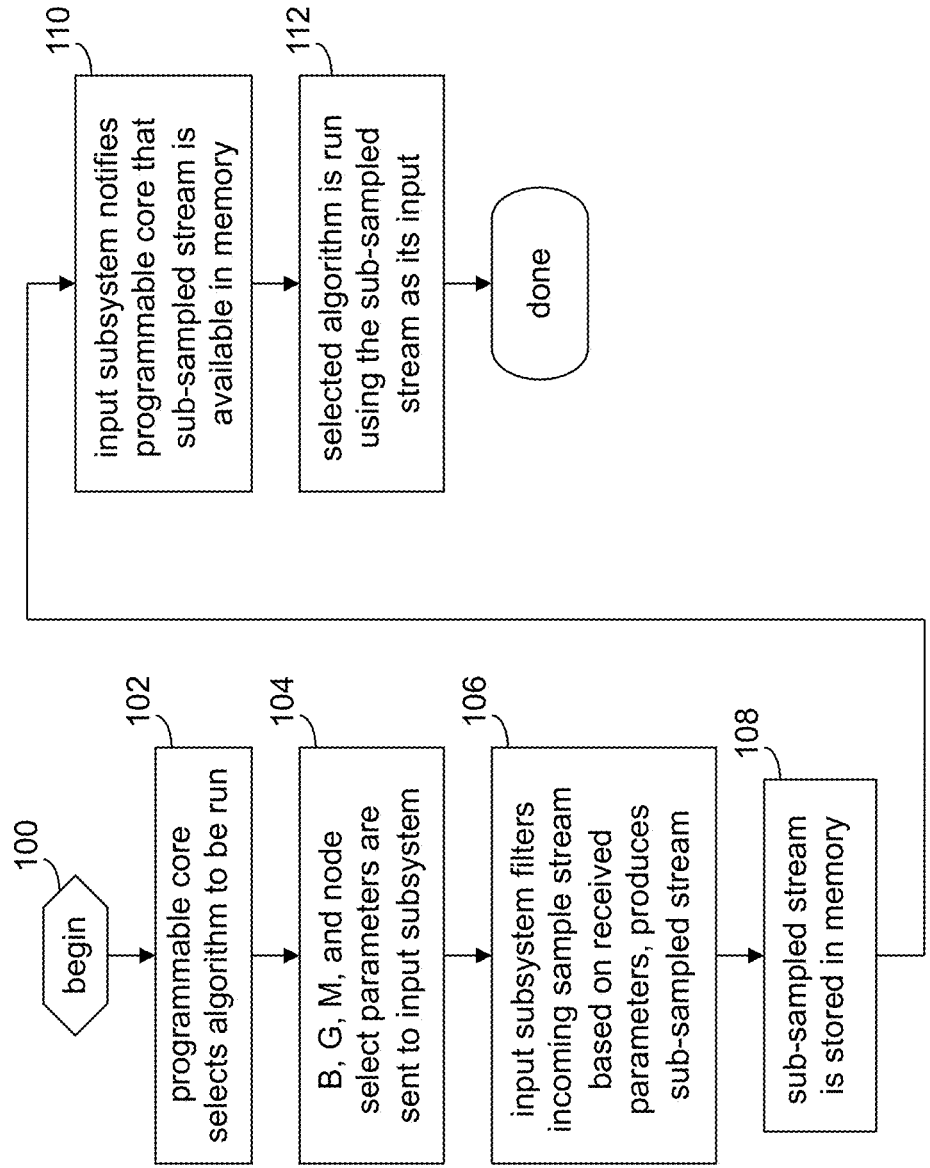
FIG. 8 is a flow diagram of operations performed by the on-die test engine of FIG. 1, according to some embodiments.

FIG. 8 is a flow diagram showing operation of the OTE 100 in sub-sampling the incoming data stream 72, according to some embodiments. First, the programmable core 60, whether through software or firmware, selects one of the algorithms (102, 104, 106) to be executed (block 102). Based on the selected algorithm, the programmable core 60 sends the burst length, B, gap length, G, number of bursts, M, and node select 112 parameters to the input subsystem 70 (block 104).

The input subsystem 70 filters the incoming sample stream, the result signal 72, based on the received parameters, to produce the sub-sampled stream 80 (block 106), which is then stored in the memory 90 (block 108). The input subsystem 70 selects one of the available incoming data streams 72, based on the node select parameter 112, and sends the selected data stream through, unchanged, as sub-sampled data 80, to the memory 90. Where the selected algorithm is one of the memory-aware algorithms, the input subsystem 70 filters the incoming data stream 72 such that the sub-sampled data 80 stored in the memory 90 is smaller than the incoming stream.

Currently, on-chip testing is not widely used for wireless radio front-ends. The main reason for this is the lack of real-time processing power (or area budget to allocate for this). This currently results in a large high-volume manufacturing testing/tuning costs, since most tuning has to be done off-chip with expensive test equipment. The OTE 100 provides an attractive alternative, due to its low cost relative to other hardware/software/firmware of the CUT.

The sub-sampling concept of the OTE 100 allows on-chip testing without the need for a large chip area dedicated to the test, while maintaining flexibility to cover a wide range of (firmware programmable) calibration and testing algorithms.

The sub-sampling concept and implementation makes on-chip self-testing and self-calibration economically viable (consuming a small chip footprint) for wireless products. In some embodiments, this results in large (>5 cents per chip) cost savings for high-volume manufacturing test costs without large area overhead (which also adds to the cost).

While the application has been described with respect to a limited number of embodiments, those skilled in the art will appreciate numerous modifications and variations therefrom. It is intended that the appended claims cover all such modifications and variations as fall within the true spirit and scope of the invention.

We claim:

1. An on-die test engine coupled with a circuit under test (CUT), the CUT comprising both an analog/RF domain and a digital domain, the on-die test engine to generate a sub-sampled data stream suitable for testing of the CUT, the on-die test engine comprising:
   a programmable core comprising a microcontroller and a software program executable by the microcontroller;
   an input subsystem to:
      receive a data stream from one or more of a plurality of nodes of the CUT, the data stream comprising one or more signals passing through the CUT, the software program to control a path of each signal passing through the CUT to selectively bypass one or more components of the CUT;
      receive a plurality of parameters from the programmable core; and
      selectively filter the data stream based on the plurality of parameters, to produce the sub-sampled data stream; wherein the sub-sampled data stream is either a first type, a second type, or a third type;
   wherein the first type consists of consecutive and non-consecutive samples from the data stream, the first type of sub-sampled data stream to be suitable for a test that is insensitive to the number of samples dropped from the data stream;
      wherein the second type consists of samples from the data stream that are contiguous in time, the second type of sub-sampled data stream to be suitable for a second test that operates using periodic samples that are contiguous;
      wherein the third type consists of samples with a burst length of one captured every $K*T_p+1$ time period, for integer k, from the data stream consisting of periodic samples with a periodicity of $T_p$ samples, the third type of sub-sampled data stream to be suitable for a third test that uses periodic samples.

2. The on-die test engine of claim 1, wherein the programmable core further: sends the plurality of parameters to the input subsystem, the plurality of parameters comprising:
   a burst length parameter;
   a gap length parameter; and
   a number of bursts parameter.

3. The on-die test engine of claim 2, the plurality of parameters further comprising:
   a node select parameter, wherein the node select parameter determines from which node or nodes of the plurality of nodes the data stream is received.

4. The on-die test engine of claim 1, wherein the programmable core updates the configuration of the analog/RF portion of the CUT.

5. The on-die test engine of claim 1, further comprising:
   a memory to store the sub-sampled data stream.

6. The on-die test engine of claim 1, wherein the programmable core further updates the configuration of one or more entities of the CUT.

7. The on-die test engine of claim 1, wherein the programmable core updates the configuration of the digital portion of the CUT.

8. The on-die test engine of claim 1, wherein the CUT is a transceiver.

9. The on-die test engine of claim 1, wherein the CUT and the on-die test engine reside on a single die.

10. An on-die test engine coupled with a circuit under test (CUT), the CUT comprising both an analog/RF domain and a digital domain, the on-die test engine to generate a sub-sampled data stream suitable for testing of the CUT, the on-die test engine comprising:
    a programmable core comprising firmware;
    an input subsystem to:
       receive a data stream from one or more of a plurality of nodes of the CUT, the data stream comprising one or more signals passing through the CUT, the firmware to control a path of each signal passing through the CUT to selectively bypass one or more components of the CUT;
       receive a plurality of parameters from the programmable core; and
       selectively filter the data stream based on the plurality of parameters, to produce the sub-sampled data stream; wherein the sub-sampled data stream is either a first type, a second type, or a third type;
    wherein the first type consists of consecutive and non-consecutive samples from the data stream, the first type of sub-sampled data stream to be suitable for a test that is insensitive to the number of samples dropped from the data stream;
    wherein the second type consists of samples from the data stream that are contiguous in time, the second type of sub-sampled data stream to be suitable for a second test that operates using periodic samples that are contiguous;
    wherein the third type consists of samples with a burst length of one captured every $K*T_p+1$ time period, for integer k, from the data stream consisting of periodic samples with a periodicity of $T_p$ samples, the third type of sub-sampled data stream to be suitable for a third test that uses periodic samples.

11. The on-die test engine of claim 10, wherein the programmable core further:
    sends the plurality of parameters to the input subsystem, the plurality of parameters comprising:
       a burst length parameter;
       a gap length parameter; and
       a number of bursts parameter.

12. The on-die test engine of claim 11, the plurality of parameters further comprising:
   a node select parameter, wherein the node select parameter determines from which node or nodes of the plurality of nodes the data stream is received.

13. The on-die test engine of claim 10, wherein the programmable core updates the configuration of the analog/RF portion of the CUT.

14. The on-die test engine of claim 10, wherein the CUT is a transceiver.

15. The on-die test engine of claim 10, wherein the CUT and the on-die test engine reside on a single die.

* * * * *